(12) United States Patent
Pupalaikis

(10) Patent No.: US 9,194,930 B2
(45) Date of Patent: Nov. 24, 2015

(54) METHOD FOR DE-EMBEDDING IN NETWORK ANALYSIS

(75) Inventor: Peter J. Pupalaikis, Ramsey, NJ (US)

(73) Assignee: Teledyne LeCroy, Inc., Thousand Oaks, CA (US)

( * ) Notice: Subject to any disclaimer, the term of this patent is extended or adjusted under 35 U.S.C. 154(b) by 991 days.

(21) Appl. No.: 13/163,914

(22) Filed: Jun. 20, 2011

(65) Prior Publication Data

US 2012/0323505 A1 Dec. 20, 2012

(51) Int. Cl.
*G01R 31/00* (2006.01)
*G01R 35/00* (2006.01)
*G01R 27/28* (2006.01)

(52) U.S. Cl.
CPC ............. *G01R 35/005* (2013.01); *G01R 27/28* (2013.01); *H04Q 2213/1316* (2013.01)

(58) Field of Classification Search
CPC .............................. G01R 35/005; G01R 27/28
USPC ................................... 324/637–646; 702/189
See application file for complete search history.

(56) References Cited

U.S. PATENT DOCUMENTS

| | | | |
|---|---|---|---|
| 7,646,205 B2 * | 1/2010 | Berlin ........................... | 324/638 |
| 7,741,857 B2 * | 6/2010 | Jagannathan et al. ......... | 324/638 |
| 2007/0276614 A1 * | 11/2007 | Tan et al. ........................ | 702/55 |
| 2010/0256955 A1 | 10/2010 | Pupalaikis et al. | |

OTHER PUBLICATIONS

Agilent, "De-embedding and Embedding S-Parameter Networks Using a Vector Network Analyzer", May 30, 2004, Application Note 1364.*

Hayden, Leonard A., et al., "Characterization and Modeling of Multiple Line Interconnections from Time Domain Measurements", *IEEE Transactions on Microwave Theory and Techniques*, vol. 42, No. 9, (Sep. 1994),1737-1743.

Bockelman, David E., et al., "Combined Differential and Common-Mode Scattering Parameters: Theory and Simulation", *IEEE Transactions on Microwave theory and techniques*, vol. 43, No. 7, (Jul. 1995),1530-1539.

Dunsmore, Joel et al., "Characterizations of asymmetric fixtures with a two-gate approach", *IEEE*, (2011),1-6.

"TDR Primer", *TDA Systems, Inc. Application Note*, (Apr. 2002),1-8.

Pupalaikis, Peter J., "Validation Methods for S-parameter Measurement Based Models of Differential Transmission Lines", *DesignCon2008*, (2008),1/25.

Metzger, Don "The Mathematics of Time Domain Substitution", *Constant Wave*, (Jun. 2010),1-8.

Pupalaikis, Peter J., "SPARQ Dynamic Range", *Technical Brief LeCroy Corporation*, (Jul. 2010),1-16.

"PCB Interconnect Characterization from TDR Measurements", *Application Note TDA Systems, Inc.*, Circuit Design Magazine,(May 1999),1-6.

(Continued)

*Primary Examiner* — Sujoy Kundu
*Assistant Examiner* — Ricky Ngon
(74) *Attorney, Agent, or Firm* — Gordon Kessler

(57) ABSTRACT

A method is provided for de-embedding fixtures and/or probes from measurements of devices where probes and fixtures are connected between the ports of a network analysis instrument and a device-under-test.

20 Claims, 11 Drawing Sheets

(56) References Cited

OTHER PUBLICATIONS

Liu, Y et al., "Impedance Measurements of Nonuniform Transmission Lines in Time Domain using an Improved Recursive Multiple Reflection Computation Method", *Progress in Electromagnetics Research*, vol. 117, (Apr. 24, 2011),149-164.

Hsue, Ching-Wen et al., "Reconstruction of Nonuniform Transmission Lines from Time-Domain Reflectometry", *IEEE*, (1997),32-38.

* cited by examiner

| RealVector $ImpedanceProfile(S_{11}, M)$ |
|---|
| Arguments: <br>     ComplexVector $S_{11}$ { <br>         An $N+1$ element vector of $S_{11}$ for <br>         each frequency point including DC <br>         and the Nyquist rate <br>     } <br>     int $M$   { <br>         The number of sections desired for <br>         the profile <br>     } |
| int $m \in \{0, \cdots, M-1\}$ |
| $\rho_m \leftarrow \frac{1}{2N} \left[ S_{11_0} + \text{Re}(S_{11_N}) + 2 \sum_{n=1}^{N-1} \text{Re}(S_{11_n}) \right]$ |
| int $n \in \{0, \ldots, N\}$ |
| Complex $z \leftarrow G(f_n) e^{j2\pi f_n (T + D(f_n))}$ |
| $S_{11_n} \leftarrow \dfrac{-S_{11_n} + S_{11_n}\rho_m^2 z^{-2} - \rho_m z^{-2} + \rho_m}{\rho_m^2 + S_{11_n}\rho_m z^{-2} - S_{11_n}\rho_m - z^{-2}}$ |
| return $\rho$ |

FIG. 4

METHOD FOR DE-EMBEDDING IN NETWORK ANALYSIS

FIELD OF THE INVENTION

The present invention relates in general to network analysis and network device measurements. More specifically, one or more embodiments relate to measurements of a device under test (DUT) whereby the measurement instrument connection to the DUT is made utilizing fixtures or probes whose effects it is desirable to remove.

BACKGROUND OF THE INVENTION

Network analyzers are instruments that characterize networks. The characterization result is known to those of ordinary skill in the art and are based on conventions that define how the network will perform under various conditions. In signal integrity applications, the common network parameters in use are scattering parameters, or s-parameters. S-parameters define port to port relationships in a network when the network is driven by a source whose impedance is set to the reference impedance and all other ports are terminated in that same reference impedance. This convention allows scattering parameters to completely define the behavior of a network under any other driving and termination conditions.

Standard instruments for s-parameter measurement include the vector network analyzer (VNA) and the time-domain reflectometer which uses techniques of time domain reflectometry (TDR). These instruments stimulate a network with incident waveforms and measure reflected waveforms at the network ports.

In the measurement of s-parameters, measurement instruments are calibrated to a reference plane. This is a location either at the ports or beyond the ports of the instrument and is usually a coaxial environment and there is a known relationship to electric and magnetic waves at the ports. These coaxial environment ports are useful connection points to the instrument because there are industry agreed upon (upper frequency dependent) standards for cables and connectors. Examples include the subminiature version A (SMA) for frequencies up to 18 GHz and the 2.92 mm or so-called K connector for frequencies up to 40 GHz.

While coaxial connectors offer a convenient, standardized connection to measurement instruments, the DUT that is being measured often does not have these connectors at its measurement ports (ones that do are so-called connectorized devices). Non-connectorized DUTs are frequently encountered in signal integrity (SI) applications where the ports of the DUT might be printed circuit board (PCB) pads or traces. In these applications measurement engineers generally employ either probes or fixtures for interfacing a DUT to the measurement instrument. These probes and fixtures must be of high quality so that the electromagnetic waves propagate between the DUT and the measurement instrument with minimal degradation. Despite their potential high quality, they present unwanted error in the measurement. It is desirable to therefore remove their effects from the measurement thereby isolating the measurement of the DUT.

There have been many methods employed for isolating DUT measurements from measurements containing unwanted error due to connection elements. These methods are loosely separated, but related, into three categories: calibration, de-embedding, and gating.

Calibration is the most complex and varied method. When used as a tool for removing fixture and probe effects, it involves duplicating the process generally used to calibrate the instrument at its usual reference plane. Methods are numerous including short-open-load-thru (SOLT), line-reflect-match (LRM), thru-reflect-line (TRL) and many others including variations on the aforementioned ones. Calibration involves the process of performing multiple measurements of standards whose characteristics are either fully known or can be inferred from the multiple measurements. When calibration is utilized for isolating a DUT measurement in the context here, the one or more standards are placed at the end of fixtures or probes and as a result of the calibration, the measurement reference plane is moved to the tip of the probe or the end of the fixture where the DUT is then connected.

There are many drawbacks, however, to these methods beyond even their general complexity. One is the requirement for multiple measurements which can be time consuming and prone to error. Another is the requirement for the standard elements themselves whose characteristics must be somehow measured or modeled. In the case of probes, generally an impedance standard substrate (ISS) is utilized. These are expensive and multiple, identical probe connections must be made to the substrate for the multiple measurements involved in the calibration. In the case of fixtures, usually multiple structures are utilized where the intent is for the structures to contain the standards coupled with paths with identical characteristics from the standard to the ports whereby the identical path characteristics are identical to the final path from measurement port to DUT port. The drawback here is again identifying the standard characteristics, but also maintaining the identical nature of the path characteristics. Also, any fixture used must generally have these standards on board.

De-embedding is mathematically complex but once this complexity is overcome, it presents other practical problems. It involves constructing a system model containing known fixture and/or probing elements and unknown DUT measurements and then solving for the unknown DUT. U.S. patent application Ser. No. 12/418,645, filed Apr. 6, 2009 to P. Pupalaikis et al., entitled "Method for De-embedding Device Measurements" deals with de-embedding efficiently. The drawback of de-embedding methods is that they still require knowledge of the characteristics of the fixture and probing elements which are often difficult to ascertain. In other words, although the de-embedding math operation can be a final step in determining the s-parameters of the DUT, some method of determining the s-parameters of the probe or fixtures to de-embed is still required.

The final method, gating, generally involves separating portions of responses generally in the time-domain. This method has the benefit of being easy to employ, but suffers from an inability to easily produce a full set of DUT s-parameters. Since s-parameter measurements are made not only for qualitative and quantitative measurements of DUT quality but also for generation of complete device models, gating cannot generally satisfy the latter requirement. Furthermore, gating methods generally do not account for a variety of effects. For example, the time-domain separation of responses does not account for reflections that occur in the measurement due to the gated out portions. There are some methods that exist that combine features of time-domain analysis and de-embedding that are referred to as gating methods (as the present method is sometimes referred to) such as described in J. Dunsmore, N. Cheng and Y. Zhang, "*Characterizations of asymmetric fixtures with a two-gate approach,*" 77th ARFTG Digest, 2011, pp. 138-143 and D. Metzger, "The Mathematics of Time Domain Substitution," http://www.constantwave.com but the former does not account for multiple reflections and uses the time-domain impulse response and neither deals with the difference between calibration measurement conditions and the DUT measurement conditions. In the first case, the goal is to analyze the fixture for de-embedding and, once the s-parameters are known, relies on the fixture conditions being substantially similar in the fixture measurement phase and the DUT measurement phase. In the second case, a ratio is performed between a calibration and DUT measurement phase that also includes the reliance on similarity of conditions of the probe and fixture in both calibration and DUT measurement phase.

A general problem that occurs with all of these methods is the maintenance of constant characteristics at the DUT measurement ports. This means that if calibration methods are employed with probes, the structure at the location where the probe tips touch down must be identical in the calibration environment as in the final measurement environment. This is difficult to maintain.

What is needed is a method that overcomes the drawbacks stated.

OBJECTS OF THE INVENTION

It is an object of this invention to provide methods for network analysis that provide for isolation of DUT measurements when the DUT is connected to the measurement instrument through probes, fixtures and other elements present in the measurement.

While in the Background of the Invention, we separated the categories for isolating the DUT from the probes and fixtures, we will refer to this concept as de-embedding, even though we made a distinction earlier. In other words, any subsequent use of the word de-embedding is intended to refer unless otherwise stated to the activity of isolating the DUT measurement from any other measurements of an overall system containing the DUT and other fixtures and probes, since that is the general term used.

In particular, it is an object of the invention to provide an easier, less complicated and less error-prone manner for de-embedding.

Finally, it is another object of the invention to provide a method that deals with certain issues that arise in calibration methods used for de-embedding such as differences between probe and fixture conditions during calibration and measurement phases.

Still other objects and advantages of the invention will in part be obvious and will in part be apparent from the specification and drawings.

SUMMARY OF THE INVENTION

In order to overcome the aforementioned drawbacks of previous methods, the various embodiments of the present method are proposed for isolating a DUT measurement when the DUT is connected to the measurement instrument through probes, fixtures and other elements.

In accordance with one or more embodiments of the present invention, an overall system s-parameter measurement may be performed where the system contains the DUT embedded in a system utilizing fixtures or probes or other elements to make the connection from the DUT to the network analyzer ports. Second, an optional but preferable calibration measurement may be performed where the system contains a calibration element whose characteristics are substantially known also connected to the network analyzer ports through the same fixtures or probes where certain characteristics of the fixtures and probes are sufficiently the same as in the DUT measurement configuration. The word sufficiently is used because the characteristics do not have to be completely the same and the criteria for sufficiency will be understood by reading the detailed description of the preferred embodiments coupled with the drawings provided. The two measurements outlined: The DUT measurement and the optional calibration measurement can be performed in any order and in fact the optional calibration measurement generally needs to be performed once for many DUT measurements.

Next, each of the s-parameter measurements may be converted to a format whereby the ports preferably exhibit little coupling for the portion of the measurement that contains the fixture or probes. This might mean converting the s-parameters to mixed-mode formats.

Then, the impedance profile may be computed looking into any ports containing fixture elements. From the impedance profile, the time location of the end of the fixture and the beginning of the DUT may be located. Alternately, in a calibration phase, probe or fixture elements configured favorably to contain either zero length thrus or known standards for identifying probe and fixture boundaries. Once the time location and hence the electrical length of the probe or fixture is known, the loss and group delay characteristics may be determined. Again, these loss and group delay characteristics can be computed in a calibration phase utilizing the present method to measure a zero length thru or other known standard, the standard is recovered.

Provided an estimate of the electrical length, and loss and group delay characteristic, on each measurement the impedance profile may be computed for the measurement looking into each DUT port for the electrical length specified utilizing the specified loss characteristics. In some cases, the initial electrical length estimate may be refined by matching known basic characteristics of the probe and fixture and DUT by determining the point of impedance discontinuity between the probes and fixtures and the DUT.

The impedance profile, coupled with the loss and group delay characteristics are converted in a manner as described in detail later into two-port s-parameters for the probe or fixture at the ports by modeling the probe or fixture as a cascaded set of small transmission line sections with a given impedance specified by the calculated impedance profile and loss and group delay characteristics either specified or determined in an optional calibration phase.

Once these two-port s-parameters are determined, they may be de-embedded from the s-parameters of the measurement containing the probe or fixtures and the DUT providing substantially correct desired s-parameters for the DUT.

The invention accordingly comprises the several steps in a particular order that should not be considered limiting in the sense that an order is required only when required based on dependencies. Furthermore, the relation of one or more of such steps with respect to each of the others, and the apparatus embodying features of construction, combinations of elements and arrangement of parts that are adapted to affect such steps, all is exemplified in the following detailed disclosure, and the scope of the invention will be indicated in the claims.

BRIEF DESCRIPTION OF THE DRAWINGS

For a more complete understanding of the invention, reference is made to the following description and accompanying drawings, in which:

FIG. 4 is an algorithm for computing the impedance profile given s-parameters of the return loss at a given port and the number of desired impedance profile sections along with a loss and group-delay characteristic for each section with frequency in accordance with an embodiment of the invention;

DETAILED DESCRIPTION OF THE PREFERRED EMBODIMENTS

Figure 1:
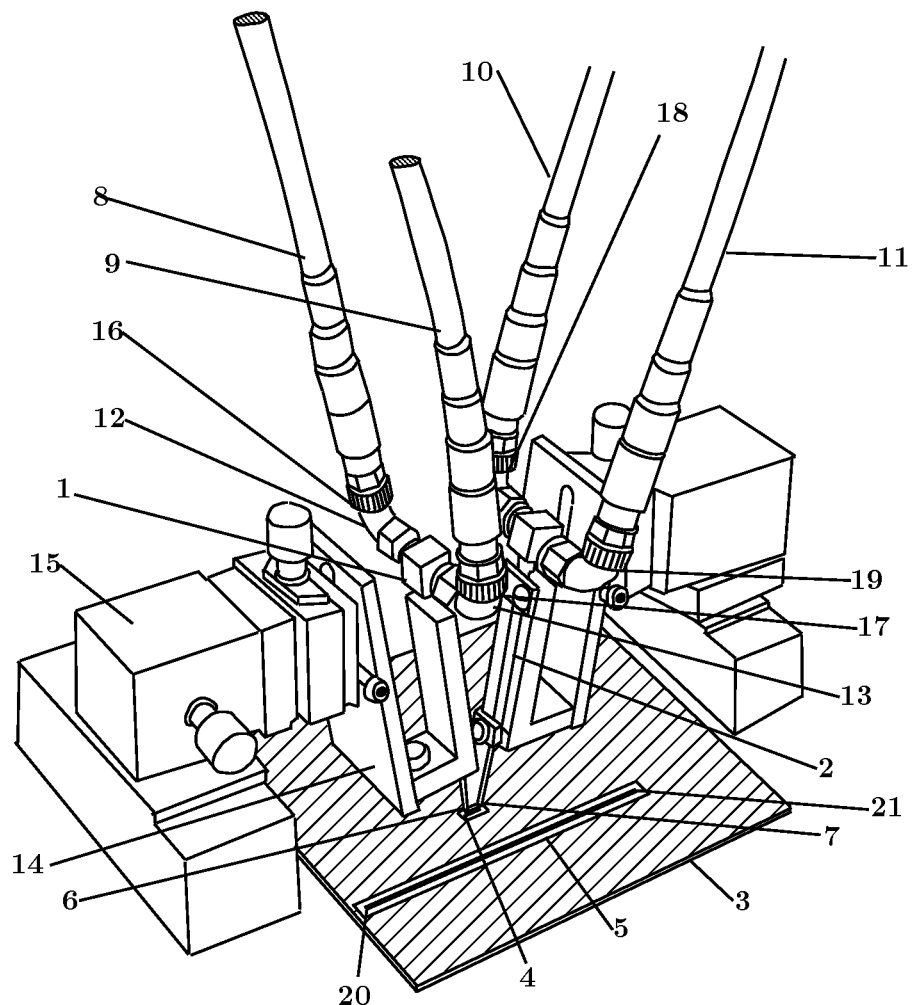
FIG. 1 is a drawing of an exemplary probing arrangement in an optional calibration phase showing a measurement reference plane, probes, and a preferred DUT measurement reference plane in accordance with an embodiment of the invention.

FIG. 1 shows an exemplary measurement arrangement in accordance with one or more embodiments of the invention. In this arrangement, a first probe [1] and a second probe [2] are shown probing a PCB trace. In this case the PCB [3] preferably contains two sets of traces; a 100 mil thru [4] and a three inch differential line [5]. FIG. 1 shows the probes [1] and [2] probing the 100 mil thru [4]. The probe tips, [6] and [7] are shown in detail probing the 100 mil thru [4] in FIG. 2. Considering probe 1 [1] (the arrangement for probe 2 [2] is similar), one sees cables [8] and [9] connected to right angle SMA adaptors [12] and [13] connected to the probe [1]. The probe [1] is held in a probe holder [14] which is positioned using a probe positioner [15]. In this particular case, the measurement is calibrated to the measurement reference planes [16], [17], [18] and [19] which are coaxial planes at the ends of the cables [8], [9], [10] and [11] respectively. The cables themselves are connected to the ports of a measurement instrument which is not shown. Because of the location of the reference planes, the measurement instrument is capable of making calibrated s-parameter measurements of devices connected directly to the cables. The DUT in the case shown is the 100 mil thru [4] in an optional calibration phase. The desired DUT measurement in the end is actually the three inch differential trace [5]. It is desirable here to make differential measurements of the DUT [5] at a different set of reference planes [20] and [21]. In order to do this, the probes are utilized and it is desirable to remove the effects of the probes from the measurement result.

A network analysis instrument is utilized to measure the 100 mil thru [4] in the probing arrangement shown in FIG. 1. A calibrated, single-ended measurement is performed at the measurement reference planes [16], [17], [18] and [19]. When there are large amounts of coupling in the probes [1] and [2] it is advantageous to convert the measurement to mixed-mode. This is because coupling implies the lack of a true impedance profile. When coupling is not present then mixed-mode conversion is optional. Mixed-mode conversion is performed using mixed-mode converters. Mixed-modes are well known to those using s-parameters for differential transmission and signal integrity and are explained in D. E. Bockelman and W. R. Eisenstadt, "*Combined Differential and Common-mode Scattering Parameters: Theory and Simulation,*" IEEE Trans. Microwave Theory Tech., vol. 43 (July 1995), pp. 1530-1539. A mixed mode converter has s-parameters given by (1):

$$S_{mc} = \frac{1}{\sqrt{2}} \begin{pmatrix} 0 & 0 & 1 & 1 \\ 0 & 0 & -1 & 1 \\ 1 & 1 & 0 & 0 \\ -1 & 1 & 0 & 0 \end{pmatrix} \quad (1)$$

Mode conversion is performed using techniques as described in P. Pupalaikis, "*Validation Methods for S-parameter Based Models of Differential Transmission Lines,*" DesignCon, Santa Clara Calif., February 2008. It is a mathematical operation as shown in (2):

$$\begin{pmatrix} S_{D1D1} & S_{D1D2} & S_{D1C1} & S_{D1C2} \\ S_{D2D1} & S_{D2D2} & S_{D2C1} & S_{D2C2} \\ S_{C1D1} & S_{C1D2} & S_{C1C1} & S_{C1C2} \\ S_{C2D1} & S_{C2D2} & S_{C2C1} & S_{C21C2} \end{pmatrix} = \cdots \frac{1}{\sqrt{2}} \begin{pmatrix} 1 & -1 & 0 & 0 \\ 0 & 0 & 1 & -1 \\ 1 & 1 & 0 & 0 \\ 0 & 0 & 1 & 1 \end{pmatrix} \quad (2)$$

$$\begin{pmatrix} S_{11} & S_{12} & S_{13} & S_{14} \\ S_{21} & S_{22} & S_{23} & S_{24} \\ S_{31} & S_{32} & S_{33} & S_{34} \\ S_{41} & S_{42} & S_{43} & S_{44} \end{pmatrix} \frac{1}{\sqrt{2}} \begin{pmatrix} 1 & -1 & 0 & 0 \\ 0 & 0 & 1 & -1 \\ 1 & 1 & 0 & 0 \\ 0 & 0 & 1 & 1 \end{pmatrix}^{-1}$$

Figure 3:
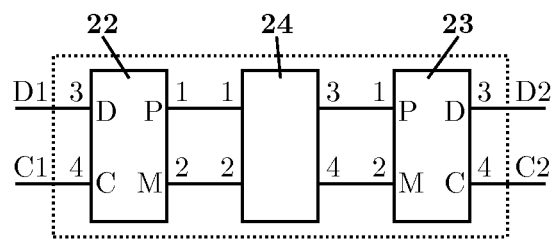
FIG. 3 is a block diagram showing schematically how single-ended s-parameters may be converted to mixed-mode s-parameters through the use of mode-converters in accordance with an embodiment of the invention.

(2) is valid when the single-ended ports are numbered such that the first set of mixed-mode ports D1 and C1 are formed by assuming that single ended port 1 and port 2 of the measurement consists of the positive and negative singled-ended signals and that the second set of mixed-mode ports D2 and C2 are formed by assuming that single ended port 3 and port 4 of the measurement consists of the positive and negative singled-ended signals as shown in FIG. 3. FIG. 3 shows a left mode converter [22] and a right mode converter [23] with port numbering corresponding to the s-parameters given by (1). In the middle lies the device [24] having single-ended s-parameters measured at the aforementioned reference planes by the measurement instrument also having the aforementioned port numbering. It is well known to those skilled in the art how to deal with different port numberings.

At this point in the discussion, it should be noted that despite the fact that we have chosen the option of converting to mixed-mode for the example, it may be optional depending on internal coupling of probes and fixtures. Furthermore, even when undergoing a mixed-mode conversion, the resulting s-parameters may continue to occupy rows and columns of a matrix and may be referred to by the row and column numbering in the traditional sense as single-ended s-parameters are referred to. In this way, we will not be using terms like $S_{D1D2}$ but instead refer to these s-parameters as $S_{11}$ given the row and column location in (2) unless we must explicitly reference the differential nature.

With the new, converted measurement, the impedance profile is preferably calculated looking into each port. The impedance profile is a calculation described in L. A. Hayden, V. K. Tripathi, "*Characterization and modeling of multiple line interconnections from TDR measurements,*" IEEE Transactions on Microwave Theory and Techniques, Vol 42, September 1994, pp. 1737-1743, in C.-W. Hsue, T.-W. Pan, "*Reconstruction of Nonuniform Transmission Lines from Time-Domain Reflectometry,*" IEEE Transactions on Microwave Theory and Techniques, Vol 45, No. 1, January 1997, pp. 32-38, and D. A. Smolyansky, S. D. Corey, "*Printed Circuit Board Interconnect Characterization from TDR Measurements,*" Printed Circuit Design Magazine, May 1999, pp. 18-26. Impedance Profile concepts are introduced in tutorial form in "TDR Primer," TDA Systems Application Note TDRP-0402.

Given the s-parameters for a measurement and a port number, an algorithm provided in FIG. 4 is preferably utilized to generate the impedance profile. FIG. 4 provides a M element vector whereby each element $\rho_m$, $m \in 0 \ldots M-1$ contains the reflection coefficient at an interface along the line. f is a vector of frequencies whereby each element $f_n$, $n \in 0 \ldots N$ contains a frequency corresponding to a port return loss s-parameter designated $S_{11}$ such that $S_{11n}$ is the return loss for a port at frequency $f_n$. The element length T is generally set to 1/4Fe where Fe is the last frequency point (i.e. $f_N$). The algorithm operates in a loop which determines the reflection coefficient at the first interface of the return loss s-parameters $S_{11}$, removes the effect of this first interface from the return loss s-parameters, and finds the reflection coefficient of the next interface by finding the reflection coefficient of the first interface in the s-parameters calculated with the interface effect removed. This allows the algorithm to properly account for all reflections caused by multiple impedance discontinuities. The impedance is related to the reflection coefficient by the well-known relationship given in (3) where Z0 is the reference impedance of the s-parameters and is arbitrary and is generally 50Ω.

$$\rho = \frac{Z - Z0}{Z + Z0} \quad (3)$$

There are other equivalent and approximate algorithms for the computation of the impedance profile such as calculating ρ as the inverse discrete Fourier transform (IDFT) of the return loss looking into a port (e.g. $S_{11}$) and other proprietary methods. In FIG. 4, there is a loss characteristic G(f) and group-delay characteristic (D(f) both of which are specified per section and are frequency dependent.

Figure 2:
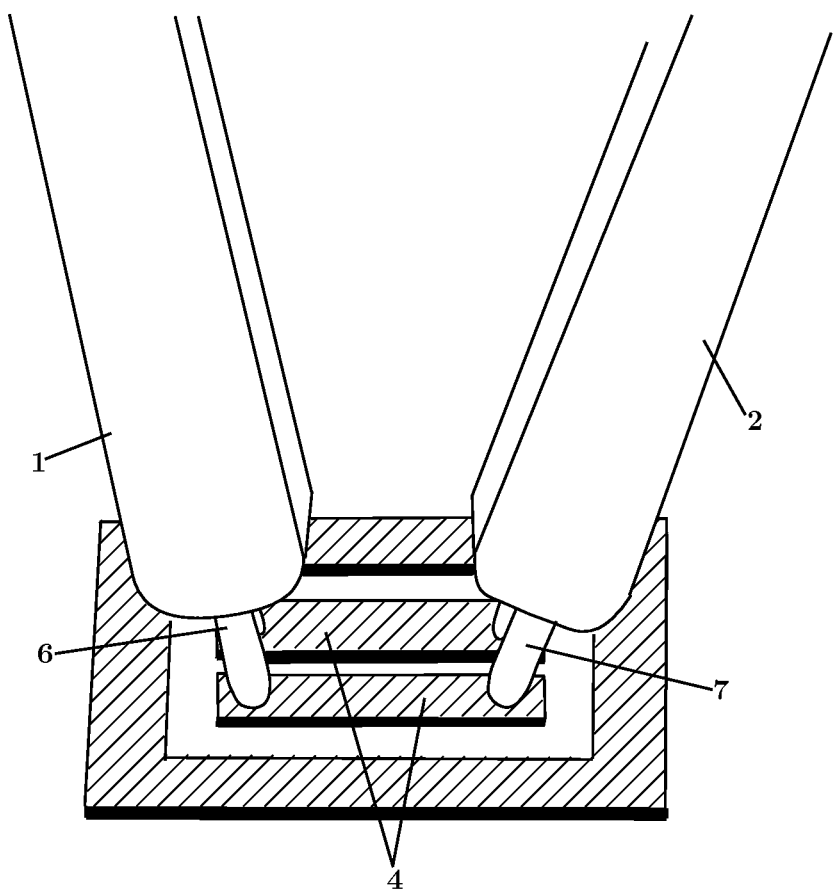
FIG. 2 is a drawing showing a zoom of the exemplary probing arrangement at the probe tips showing the tips and a 100 mil thru line being probed.
Figure 5:
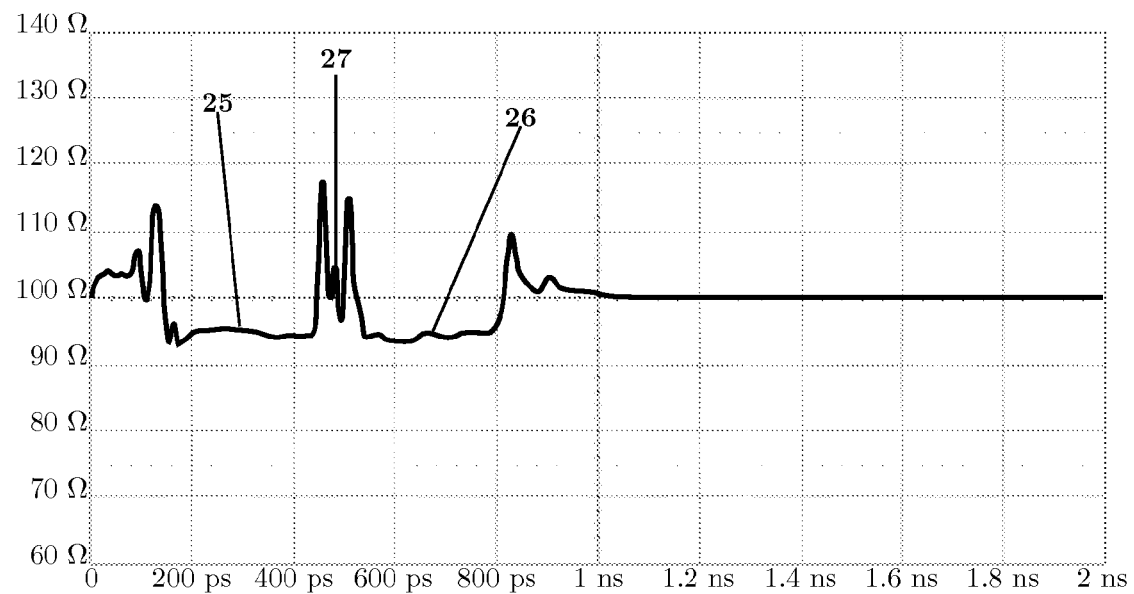
FIG. 5 shows the impedance profile of an exemplary 100 mil thru measurement.

The impedance profile applied to port 1 of the differential s-parameters obtained in the measurement shown in FIG. 1 and FIG. 2 is shown in FIG. 5. In FIG. 5, the symmetry is clearly evident. A first probe portion [25], a second probe portion [26], and in the middle, the impedance [27] of the 100 mil thru element are shown. Observe that the second probe portion [26] looks substantially like a folded over version of the first probe portion [25] about the middle [27]. It does not look identical because it's a different probe and because of losses in the system. From FIG. 5 it's easy to ascertain that the probe tips are about 468 ps into the line electrically. It's very important to note that this is for the differential mode. The common mode typically propagates at a different velocity and the impedance profile would show a different electrical length in a common-mode sense.

In this optional calibration phase in accordance with an embodiment of the invention, the impedance profile is cut 468 ps in and the impedance of the elements are assembled into a model of the probe. This model is generated by assuming that each section of the probe (each point in the impedance profile) consists of a transmission line with the length corresponding preferably to one-fourth of the reciprocal of the last frequency in the s-parameters and the impedance is the impedance specified by the impedance profile. Loss characteristics may be assumed to be a function with frequency such that the final measurement of the 100 mil thru matches our expectations. This will be explained shortly.

Figure 6:
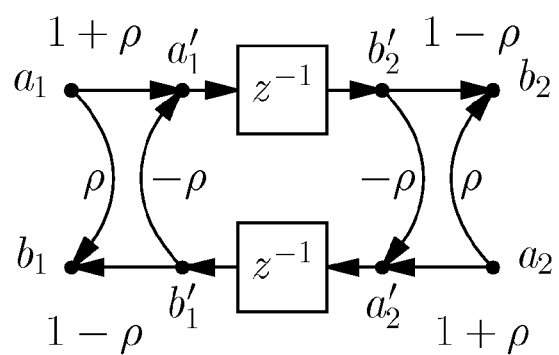
FIG. 6 is a signal flow diagram representation of a single transmission line section.

A single section of transmission line can be approximated as shown in FIG. 6 where ρ is given by the impedance of the section Z and (3) and z is given by (4):

$$z = G(f)e^{j2\pi f(T+D(f))} \quad (4)$$

The s-parameters of a transmission line section are therefore given by (5):

$$S_{tl} = \frac{1}{1-z^{-2}\rho^2}\begin{pmatrix} \rho(1-z^{-2}) & (1-\rho^2)z \\ (1-\rho^2)z & \rho(1-z^{-2}) \end{pmatrix} \quad (5)$$

In (4), as was explained, the value of T, the section length is clear and the frequency f is just the frequency corresponding to the s-parameters. G(f) and D(f), the frequency dependent gain and group delay respectively can be determined by other means by examining the port-to-port responses. Here, as an example, no frequency dependent group delay was selected and a loss characteristic of 80 mdB per GHz of frequency per ns of length was chosen. The way this was arrived at will be explained subsequently.

Given now the characteristics of each transmission line section, we convert these to T-parameters. The T-parameters for a section of transmission line is given by (6):

$$T_{tl} = \frac{1}{z(\rho^2-1)}\begin{pmatrix} \rho^2 z^2 - 1 & \rho(1-z^2) \\ \rho(z^2-1) & \rho^2 - z^2 \end{pmatrix} \quad (6)$$

For a given length of the impedance profile presumed to contain the probe, each of the transmission line sections are cascaded. This means that for some $m \in 0 \ldots M-1$, where M now contains the number of desired sections and for some number of frequency points N+1, $n \in 0 \ldots N$ such that $f_n$ is a given frequency in the s-parameters, we compute the T-parameters of the entire probe as (7):

$$T_{probe_n} = \prod_{m=0}^{M-1} T_{tlm}(\rho_m, z_n) \quad (7)$$

When the length of the impedance profile to use is not an exact multiple of the section length (i.e. the value M is not an integer, the T-parameters of the probe are calculated by using the next lower integer for M and apply the final section's T-parameters with a smaller section length. This can also be performed using interpolation for the last section.

The T-parameters for the probe now given by (7) may be converted back to s-parameters using the well-known formula for two-port elements given by (8):

$$S = \frac{1}{T_{22}} \begin{pmatrix} T_{12} & |T| \\ 1 & -T_{21} \end{pmatrix} \quad (8)$$

Figure 7:
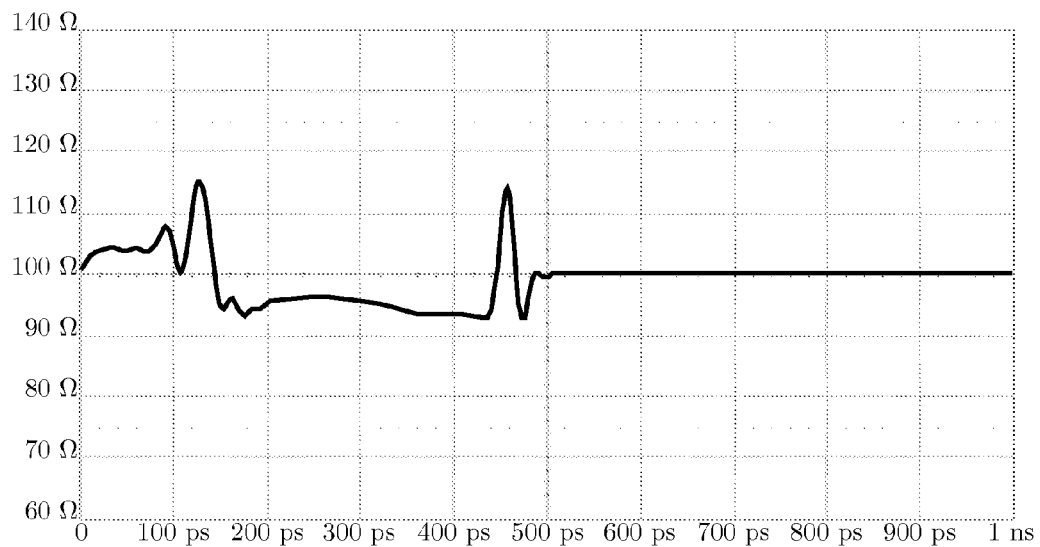
FIG. 7 shows the impedance profile of a probe.
Figure 8:
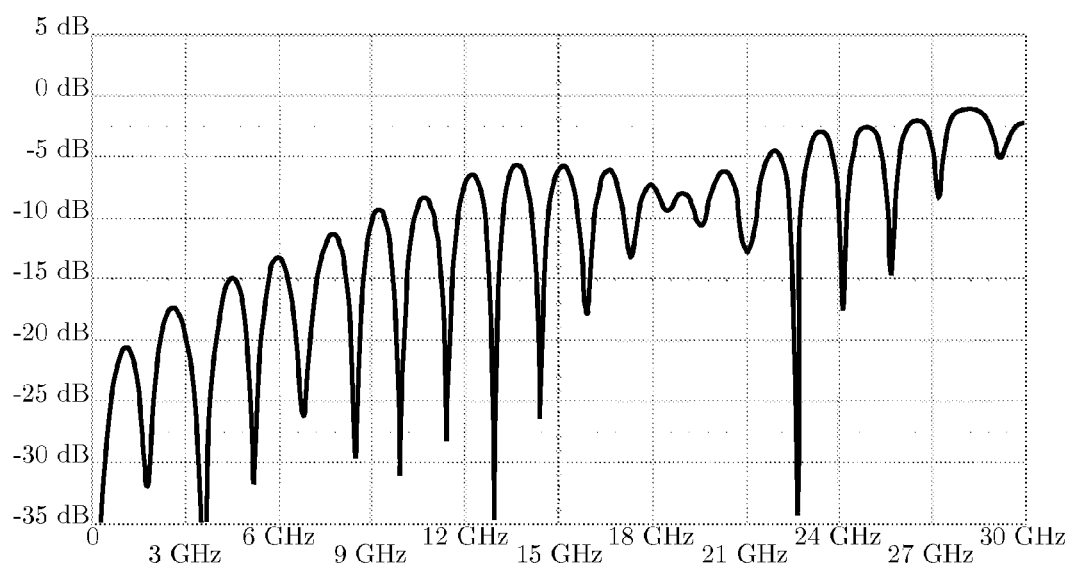
FIG. 8 shows the magnitude of the return loss of a probe calculated using a model generated based on the impedance profile, electrical length, loss and group delay characteristics.
Figure 9:
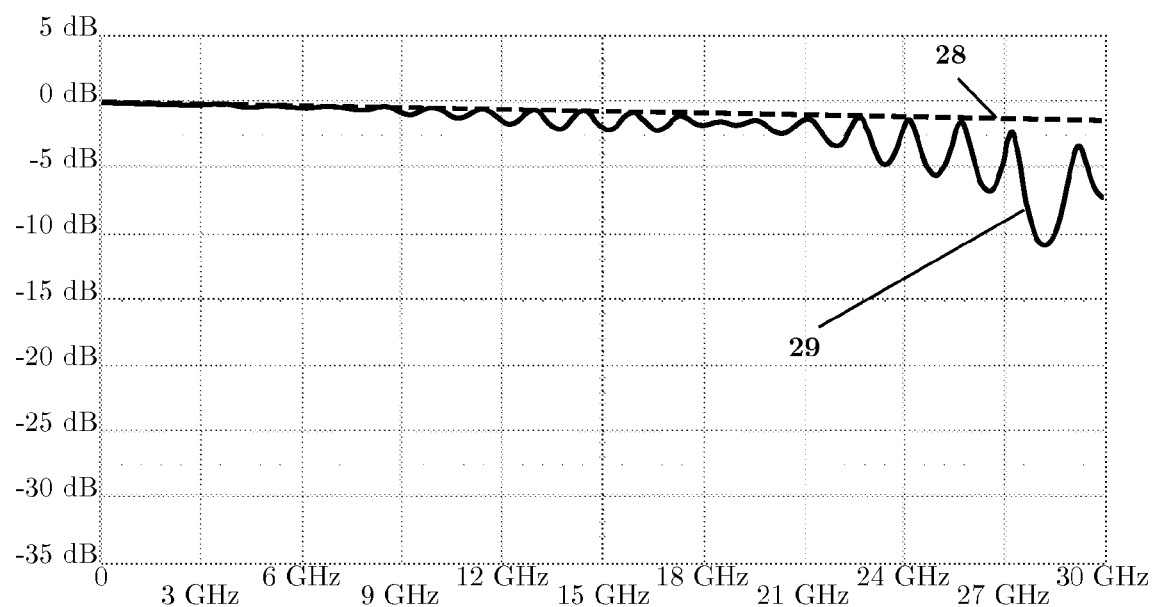
FIG. 9 shows the magnitude of the insertion loss of a probe calculated using a model generated based on the impedance profile, electrical length, loss and group delay characteristics.

The probe s-parameters are determined by repeating the steps to now on each port. The impedance profile for the probe on port 1 here is shown in FIG. 7 where it clearly resembles the left portion [25] in FIG. 5. The $S_{11}$ magnitude is shown in FIG. 8 and the $S_{21}$ magnitude is shown in FIG. 9. Regarding FIG. 9, the insertion loss [29] is shown along with a line [28] showing the portion depending on the specified loss of 80 mdB per GHZ per ns, which comes to about 1 dB at 30 GHz. Without the loss dependent effect [29] would be tilted up. Most of the effect of the probe on the insertion loss comes about predominantly by the internal reflections in the probe due to impedance discontinuities.

Given now the s-parameters of the probing elements calculated up to now based on the present method, the probe elements may be de-embedded from the measurement using methods such as those provided in U.S. patent application Ser. No. 12/418,645 entitled "Method for De-embedding Device Measurements". This application is a special de-embedding case, so special formulas can be used to solve for the DUT. The pattern here is that for a system containing two-port devices whose s-parameters are known at the tips of a device whose s-parameters are not known, then the s-parameters of these two-port devices appear located along the diagonal of block matrices. In fact, for a P-port device with unknown s-parameters with each port $p \in 1 \ldots P$ connected to port 2 of a two-port device with s-parameters designated as $S_p$ and port 1 of the two-port device connected to the measurement port p, then the de-embedding problem is solved simply by setting each element of the diagonal block matrices as:

$$F_{re_{pp}} = S_{P_{rc}} \quad (9)$$

In (9), both $r \in 1, 2$ and $c \in 1, 2$.

In other words, for example, block matrix $F_{11}$, contains all of the $S_{11}$ s-parameters of the two-port elements. Similarly $F_{12}, F_{21}$ and $F_{22}$ contain all of the $S_{12}, S_{21}$ and $S_{22}$ s-parameters, respectively of the two-port devices. These s-parameters are located on the diagonal at a location corresponding to the port number of both the system and the DUT. Then, the DUT is solved for as:

$$B = F_{12}^{-1}(Sk - F_{11}) \quad (10)$$

$$A = F_{21} + F_{22}B \quad (11)$$

And Finally:

$$SU = BA^{-1} \quad (12)$$

In (10), the measured s-parameters by the measurement instrument may be referred to as Sk because they are the known s-parameters. In (12), the final DUT s-parameters are referred to as Su because they are, up to this point, the unknown s-parameters.

Figure 10:
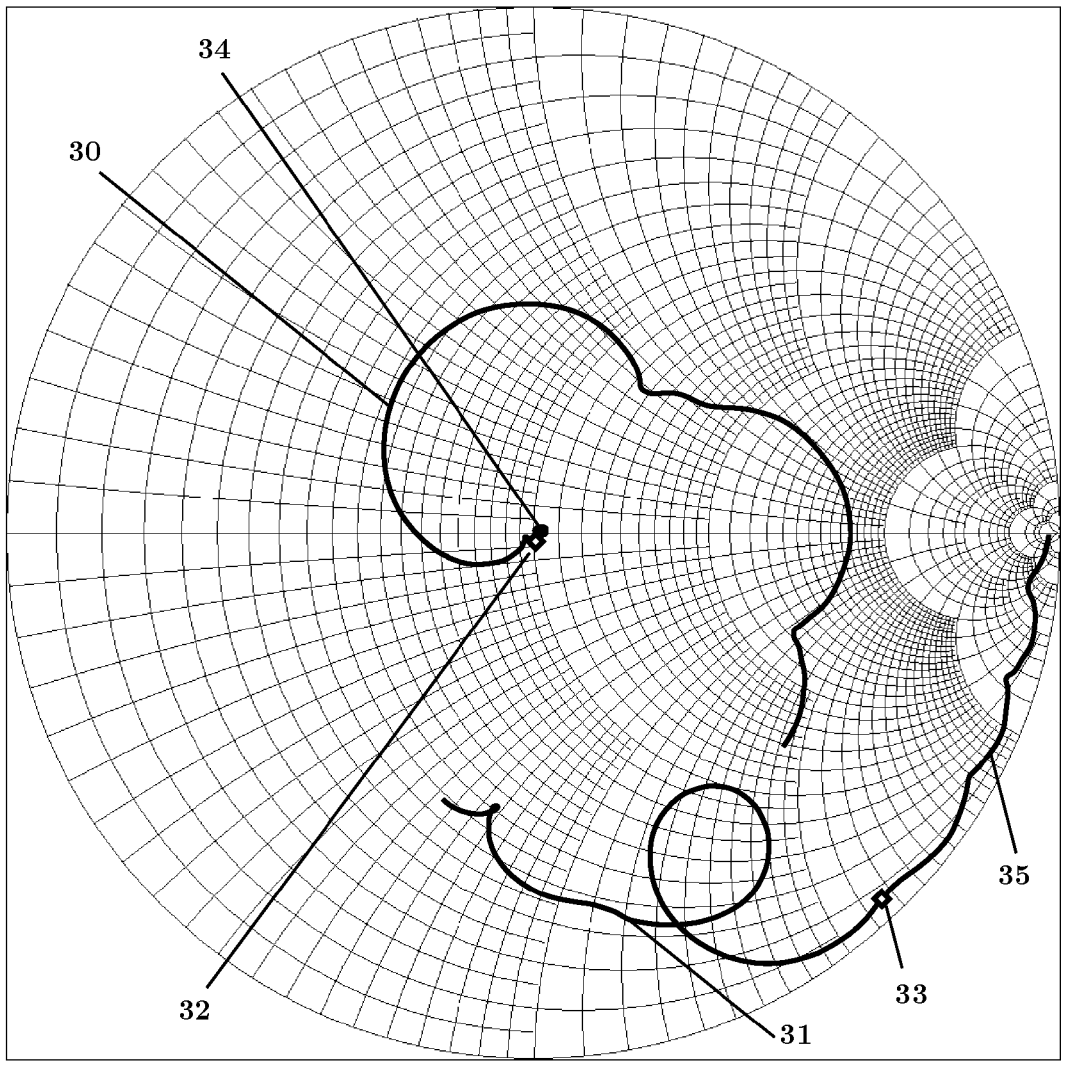
FIG. 10 is a Smith chart representation of the measurement of a 100 mil thru trace utilizing the present method for removing probe effects.

When the calculated probe s-parameters are utilized in a de-embedding arrangement in these previous equations in the measurement of the 100 mil thru, we recover the thru as shown on the Smith chart in FIG. 10. Here, the match [30] and the insertion loss [31] are shown. It can be seen that the match [30] starts as a tight trace about the origin at 50Ω and eventually spirals outwards. Furthermore, the insertion loss [31] starts as an arc that eventually spirals inwards. A marker at 8 GHz is placed on the match [32]. Similarly, a marker at 8 GHz is placed on the insertion loss [33]. The match characteristics from DC to 8 GHz [34] show a very good match. Similarly, the insertion loss from DC to 8 GHz [35] shows an arc that subtends and angle of about 40 degrees. 40 degrees at 8 GHz corresponds to approximately 14 ps which predicts an electrical length of approximately 140 ps per inch which predicts a propagation velocity of about 0.6 the speed of light. So, it seems that up to 8 GHz, the method provides reasonable results (the probes in this example utilize an SMA connector which is good to a maximum frequency of 18 GHz). It should be clear now that the loss characteristics were determined previously such that the 100 mil thru measurement was calculated as expected. In other words, the 100 mil thru here is essentially treated as a standard utilized in a calibration phase.

While up to this point, a measurement of a 100 mil thru measured with probe effects substantially removed has been demonstrated, it is important to understand that the s-parameters of probe elements to de-embed in subsequent measurements have not necessarily been determined. In other words, it is not the intent here to utilize the s-parameters of the probe elements de-embedded here in subsequent measurements and calculations directly as is. It is the intent, however, to utilize general characteristics determined for the probe to this point including an estimate of electrical length and an estimate of loss and group delay characteristics. These features of the present method will be appreciated after the subsequent discussion.

Figure 11:
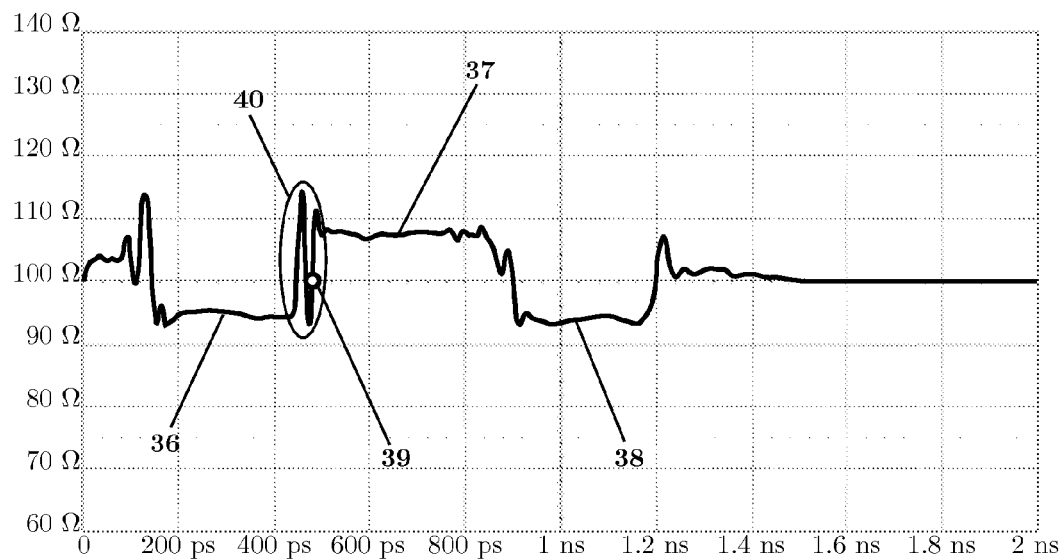
FIG. 11 shows the impedance profile of an exemplary three inch differential trace measurement.

Now that the probe general characteristics have been ascertained, for this example, the three inch line [5] is measured. FIG. 11 shows the impedance profile calculated from a measurement taken of the three inch line again at the reference planes of the measurement instrument. Here we see again on the left a first probe portion [36], a portion due to the three inch line [37] and a portion due to the second probe [38]. A marker [39] is preferably placed in the vicinity of the electrical length of the probe at 468 ps. The marker [39] demarcates the first probe portion [36] from the line portion [37] (there is no clear demarcation between the line and the second probe portion as this is taken care of by performing the de-embed from the other measurement port). The first probe portion [36] is very similar to the impedance profile of the probe only when measured in the 100 mil thru measurement arrangement as shown in FIG. 7 except for the tip location highlighted [40]. This is the probe touchdown point and the actual behavior of the probe in conjunction with the line in this area is as much a function of the probe as it is of the line. This is a key point because typical calibration and de-embedding methods have difficulty dealing with this effect. In typical calibration methods, efforts are made to ensure that the probe touchdown point is very similar in nature in the DUT measurement as it is in the standards measurement. This cannot always be ensured. This is a similar situation in typical de-embedding methods as a de-embedding element is generated in one measurement phase and is used in another thereby having the same requirement on similarity of probing point.

Utilizing the present method, the same operations are preferably performed on the DUT measurement as were performed in the measurement of the 100 mil thru that was utilized in an optional calibration phase. The impedance profile is measured looking into each port for a predetermined length of the probe—in this case 468 ps, with a predetermined loss characteristic of 80 mdB per GHz per inch. The present method anticipates that this electrical length value and the loss and group delay values could be re-estimated during the DUT measurement phase, but here we have chosen to ascertain these values during a calibration phase. The new impedance profiles, in conjunction with predetermined or newly estimated electrical length, loss and group delay characteristics are once again formed into a transmission line model and de-embedded from each port of the measurement. Note that by doing this, any difference in probe characteristics, especially any difference in the area of the probe touchdown points at the DUT are taken into account since the de-embed structure was calculated off of the measurement taken during the DUT measurement phase.

Figure 12:
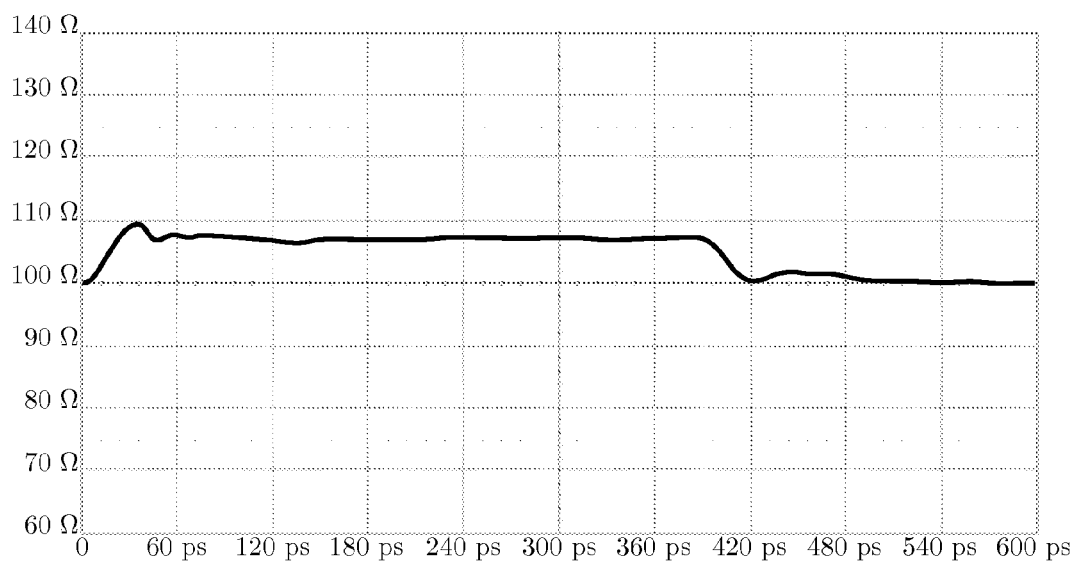
FIG. 12 shows the impedance profile of an exemplary three inch differential trace as a DUT utilizing the present method for removing probe effects.
Figure 13:
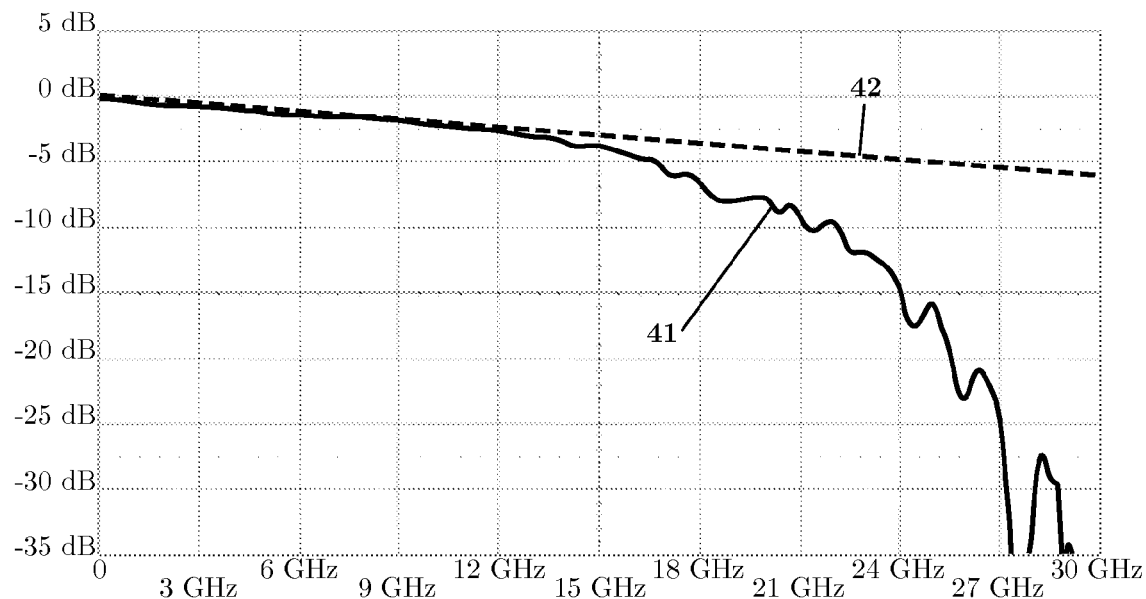
FIG. 13 shows the magnitude of the differential insertion loss of an exemplary three inch differential trace as a DUT utilizing the present method for removing probe effects.

The results for the example used are now provided. The impedance profile of the DUT generated according to the present method is shown in FIG. 12 where it is seen that the line is slightly less than 420 ps in electrical length and is a reasonably homogeneous 107Ω throughout its length. 420 ps over three inches is about 140 ps per inch, which again predicts a propagation velocity of approximately 0.6 the speed of light. This is encouraging since here the 100 mil trace and the three inch trace are similar in construction. The measurement of differential insertion loss for the DUT is shown in FIG. 13 where it shows a loss of 2.3 dB at 8 GHz and 1.77 dB at 10 GHz for a reasonably linear characteristic in loss of 74-77 mdB per GHz per inch.

Figure 14:
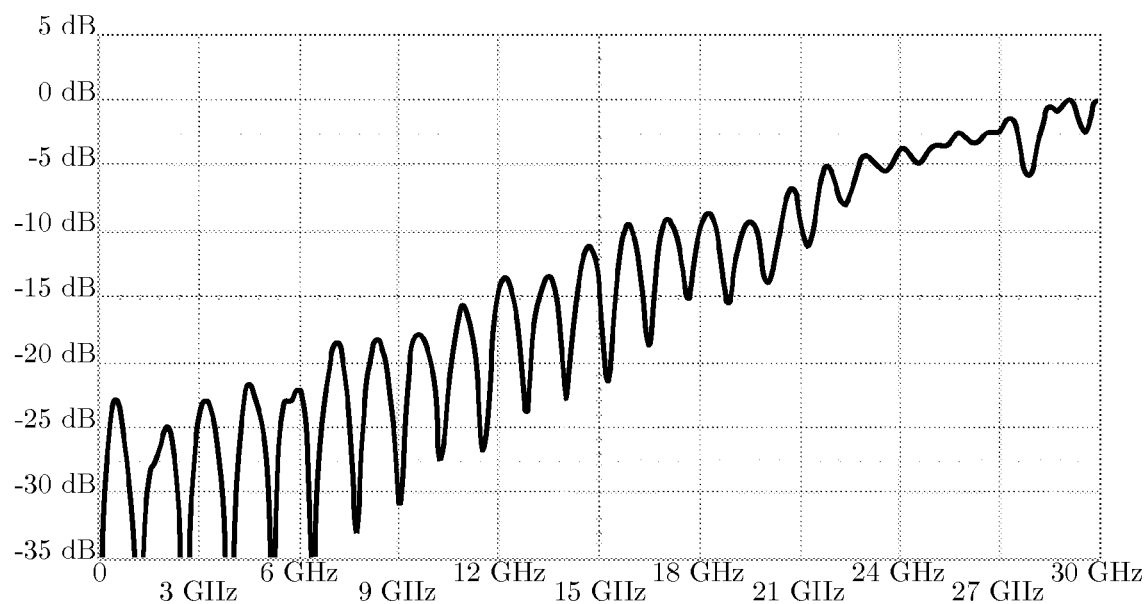
FIG. 14 shows the magnitude of the differential return loss of an exemplary three inch differential trace as a DUT utilizing the present method for removing probe effects.

The measurement result using the present method is shown in [41] while an independent measurement using higher bandwidth methods are shown in [42]. It can be seen that the correlation is very good certainly up to 12 GHz. It is important to note that the deviation beyond 12 GHz is a property of the characteristics of the probes utilized and is not related to the method taught here. In fact the independent method utilized both the present method with probes that are rated to about 20 GHz in conjunction with other more sophisticated, but difficult to implement in practice, calibration methods. The differential return loss characteristics are shown in FIG. 14

While the process of the present method has been described through an example measurement, it is helpful to provide more details and describe certain options that can be used with the method being proposed here:

First, in an optional calibration phase, a measurement of a known thru element is proposed. This measurement is intended to tune characteristics, with the most important being, while not limited to, the loss characteristics. The loss characteristics may be determined in many ways. One way is to first examine the impedance profiles looking into each port to identify the electrical length of the probe or fixturing. This can also be determined automatically provided some a priori knowledge of the probe characteristics (i.e. a general model which might consist of coarse transmission line sections and lumped inductance, capacitance and resistance values). The coarse model can be fit to the impedance profile measured, or one can go in the reverse direction where the model provides some general probe characteristics with the impedance profile determining a model of finer detail. Regardless, the idea is to have some general idea of the probe characteristics. Alternately, knowledge of the standard used during a calibration phase may suffice in that once this is known, the probe or fixture can be determined in the impedance profile.

In a preferred embodiment, the general model may be used to determine the electrical length of the probe or fixture and the impedance profile cut to the electrical length provides a detailed model of the probe or fixture. Coming back to loss, in a preferred embodiment, the loss measured through the back-to-back measurements of the probe or fixturing is apportioned to a left or right side and when the probe or fixturing is generally symmetric, it can be apportioned equally to each side with little loss of accuracy. The word apportioned is used here to imply that the insertion loss measurements may be divided and applied directly to each probe or fixture side. Alternately, as used in this example, the loss may be dialed in, or fit as a model until the thru response matches the thru standard measurement. Generally, the thru standard is an electrically short, well behaved element anyway.

Popular ways of fitting a model of loss is to use a linear loss characteristic, as used in the example which is good for loss characteristics dominated by dielectric loss effects. Alternately, another method is to use a loss characteristic that varies with the square-root of the frequency which provides a loss characteristic common when skin-effect dominates. Finally, it is popular to incorporate both utilizing a fit as provided in Appendix B of P. Pupalaikis, "*SPARQ Dynamic Range,*" LeCroy Technical Brief, 2010. It is important to note that insertion loss measurements like $S_{21}$ typically consist of both loss due to copper or $I^2R$ losses and dielectric losses, and loss due to impedance mismatch. While the latter is not really loss, per se, it is always present in the measurement of insertion loss s-parameters and in this case, are removed from the loss characteristic through the de-embedding of the model generated from the impedance profile exposing a true loss-characteristic to apply. In FIG. 4 where the impedance profile is calculated, during the calibration phase, the loss characteristic and group-delay characteristic is applied on a per-section basis where the group-delay characteristic is a deviation from the simple delay occurring due to the electrical length of a section. Generally, the loss is applied evenly distributed across the electrical length unless a priori knowledge dictates otherwise concentrations of loss in particular sections. One must also be aware that the reflection through a transmission line section must traverse twice the length of the section while apportioning loss and group-delay.

We stated here that the loss characteristic is measured in an optional calibration phase, but this phase can be sidestepped with actual s-parameter measurements or estimates of s-parameters for a given probe or fixture. In the case of being provided actual s-parameter measurements, the prior art generally uses this directly in a de-embedding process. It will be discussed subsequently why the present method provides some benefits to direct de-embedding in this regard. In the case of being provided an s-parameter measurement of a typical probe or fixture or a direct sparameter measurement of a particular probe or fixture, it is advantageous to follow the steps in the previous paragraph to remove the impedance mismatch effects prior to application of the loss characteristic.

In some cases, the frequency over which the de-embedding is valid is lower than the maximum frequency of the measurement. In signal-integrity, this might be true for a number of reasons with the most prevalent being that it is advantageous to generate s-parameter models at higher frequencies than they are used. This avoids certain frequency truncation effects in time-domain simulations using frequency-domain based models. When this is the case, it may be useful to allow the loss and group-delay characteristics to be tailored beyond the useful frequencies to avoid problems in the probe and fixture model generation in this method. For example, while the loss measured might start to drop beyond the useful frequencies of a probe in a calibration measurement, it may not be a good idea to try to compensate out that loss. Rather, it may be preferable to level off the loss characteristic to avoid excessive compensation despite the actual measured loss characteristic.

While pointed out in the example, it should be reiterated here that the present invention can be applied in a single-ended manner or to mixed-mode measured s-parameters in a measurement and optional calibration phase. Generally the decision here involves coupling of lines in the probe or fixture. When lines are coupled, there is no single-ended impedance profile per se and it is preferable to convert to mixed-mode prior to application. While conversion to mixed mode mitigates to a large degree the coupling effects it does introduce the possibility for mode-conversion generally shown as cross-terms in the mixed-mode s-parameters. Fortunately, these are usually small.

In one embodiment, the present method can be applied to some portion of the measurement in a single-ended manner, for example in areas of the probe or fixture where coupling is minimal, and applied in other portions of the measurement in a mixed-mode manner where coupling is an issue. When applied this way, it can also mitigate skew effects. The example provided showed only an application to mixed-mode, or more specifically in this case, the differential-mode s-parameters but it is important to understand that the example was not intended to be limiting in this manner. Furthermore, all of the preceding comments about loss and electrical length characteristics should generally be applied separately to the differential-mode and common-mode signals. This is because when lines are coupled, each of these modes propagates at a different velocity and the common-mode (and even-mode) impedance differs from the differential-mode (and odd-mode) impedance. Finally, the loss characteristics differ.

It should be mentioned that while the loss characteristic is of high concern, the group delay characteristics are also of concern and can be handled in an analogous manner as pointed out during the loss characteristics discussion. In other words, group delay characteristics can be measured using the thru response and apportioned appropriately on each port of the measurement just as the loss characteristics can be.

Provided now an electrical length and loss characteristic, the present method preferably uses this information in a measurement phase. Preferably, and in the example provided, one uses the electrical length exactly as provided, but it is also possible to once again identify the probe or fixture portion in the measurement. For example, in the example used, specifically at the probe touchdown point [40] shown in the impedance profile of FIG. 11, one can see that given a general probe model, it is easy to identify the probe electrical length. So, in another embodiment, the electrical length provided in a calibration phase or estimated from measured or provided probe characteristics is utilized as an estimate to be refined during the measurement phase to determine the length of the impedance profile.

Since the electrical length can be determined during the measurement phase and can therefore be different than the electrical length utilized to determine the loss characteristics, it is advantageous to allow for the possibility of adjusting the loss characteristic based on changes to electrical length. These adjustments are usually quite small relative to the electrical length of the fixture or probe such that these adjustments can generally be neglected.

As mentioned earlier, the probe or fixture model or measurement generated during an optional calibration phase or through modeling based on known probe or fixture characteristics can be utilized as an element for de-embedding using traditional methods but in a preferred embodiment, the probe or fixture characteristics are determined or possibly refined again during the measurement phase. The advantages of this are clear with regard to probes and fixtures because of two measurement situations endemic to traditional methods.

The first situation involves calibration. When traditional prior art calibration methods are utilized there are always assumptions depending on the algorithm. An important assumption in many advanced calibration methods is an assumption of sameness or similarity of probe and fixture characteristics during both a calibration and measurement phase. Many advanced calibration algorithms such as TRL have assumptions that the launch portion of the fixturing to the standard is the same or similar in both the calibration and measurement phase. In practice, it is impossible to guarantee fully this similarity and any lack of similarity causes the measurement results to degrade. The challenge therefore with an algorithm like TRL is to ensure through careful engineering this similarity.

The second situation that arises is particularly prevalent with regard to probing involves the parasitics in the tip structure and their interaction with the DUT. Many high-performance probes are calibrated to the probe tip utilizing known standards by sequentially performing measurements of these standards through the probe by touching the probe down on a substrate containing the standards. It is relatively easy to control the quality of the standards and to match the standards to the probe itself in both pitch and characteristics. When calibrated measurements are utilized during a calibration phase and the error-terms generated as a result of the calibration are applied on top of an already calibrated measurement instrument, this is called a second-tier calibration and the calibration functions to de-embed the probe as the main side-effect of applying the calibration. It is not very complicated to make a quality probe calibration using substrate standards. The problem comes in matching the characteristics of the probe-standard interface encountered during calibration phase to the characteristics encountered during a measurement phase, specifically at the location where the probe tips touch down on the DUT. Generally, the characteristics are different, especially in a signal integrity testing environment where the ISS used to calibrate the probe are high-quality and generally expensive and the DUT being measured may be lower quality and cheaper. When the parasitics of the probe tip to DUT interface are different during the measurement phase from the calibration phase, the error created is seen most acutely in the impedance profile. Many microwave engineers who are less concerned with time-domain characteristics don't notice these differences but this time-domain difference of the impedance profile is seen as a degradation in the return-loss or $S_{11}$ performance.

Figure 15:
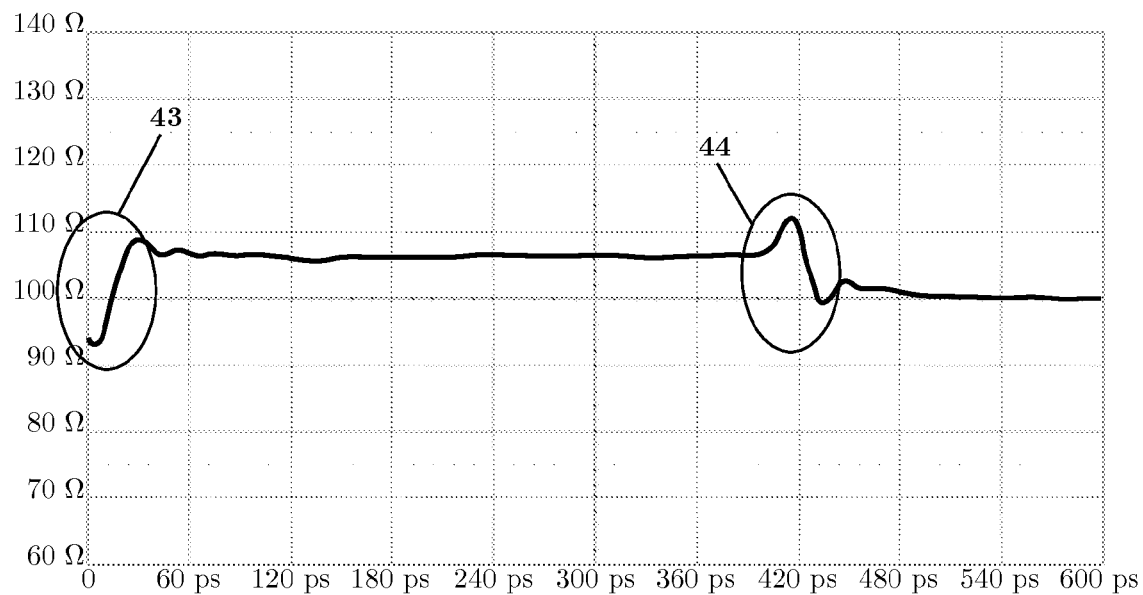
FIG. 15 shows the impedance profile of an exemplary three inch differential trace as a DUT utilizing prior-art methods for removing probe effects.

As an example, FIG. 15 shows an impedance profile generated of the same three inch line measured using higher quality probes then used in the example and using a very sophisticated calibration algorithm to perform the de-embedding. One can observe that the characteristics of the impedance profile along the line are roughly the same as found utilizing the present method and as shown in FIG. 12 except at the edges where the probe is touching down on the DUT. Here we see two discontinuities; one on the left [43] and one on the right [44]. The left discontinuity [43] exhibits a DUT with a lower impedance signifying excess capacitance in the measurement at the probe touchdown point and the right discontinuity [44] exhibits a DUT with higher impedance signifying excess inductance. These errors are thought to be due to differences between the probe tip environment during a calibration phase and a measurement phase. The present invention eliminates this problem because any excess parasitic inductance or capacitance at the probe touchdown point, in a preferred embodiment, is removed by directly measuring this in the measurement phase, thus the de-embedded probe tip portion contains the appropriate characteristics.

As can be seen, the present invention is particularly useful when PCB trace characteristics are being determined. What is desired in this case is an impedance measurement without the tip interactions. While the impedance can still be measured by placing a marker or cursor along the line in the case of prior-art methods, it is desirable that the model extracted for the line does not have these adverse effects.

Finally, the present method can be utilized in a hybrid measurement arrangement, if so desired. In other words, prior-art methods of calibration and de-embedding can be utilized up to a point and the method of the present invention can be utilized to augment the result by working over a shorter section containing the most changing characteristics—in this case the probe tip to DUT interface. Furthermore, utilizing the method presented here, problems can be anticipated and mitigated in traditional methods by including an offset length in the standards. In other words, instead of making the standards as short as possible, an extra offset can be added. If the standard definition does not include this offset, the reference plane will be placed predictably in an incorrect location and the present method can take over to remove the remaining predictable effects.

In the case FIG. 15, this method anticipates generating the impedance profile of the DUT measured through any of the variety of prior-art techniques and simply replacing portions of the profile with more desirable information. In other words, in the case presented here, simply replacing the left discontinuity [43] and the right discontinuity [44] with a smooth shape from 100Ω to the impedance of the line, one can regenerate the return-loss s-parameters and model of the line itself with the adverse effects of the probe error removed.

While throughout this application the words "probes" and "fixtures", etc. have been used, these are simply words describing connection elements between the DUT and the measurement ports at the measurement reference plane.

Figure 16:
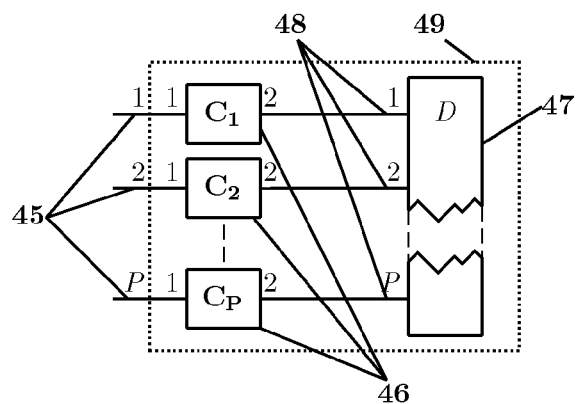
FIG. 16 shows a block diagram of the relationships between connection elements and the DUT in a measurement phase.
Figure 17:
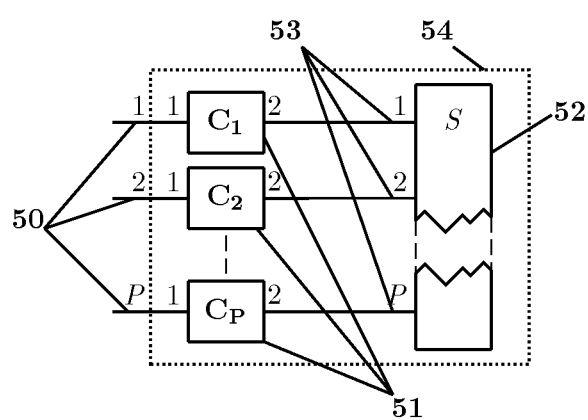
FIG. 17 shows a block diagram of the relationships between connection elements and a standard in a calibration phase.

To clarify terminology, refer to FIG. 16 and FIG. 17. FIG. 16 shows a block diagram of a system [49] in a measurement phase containing a DUT [47] and multiple connection elements [46]. The DUT [47] is connected such that the DUT ports [48] are each connected to a second port of each of the connection elements [46] and the first port of each of the connection elements [46] are exposed as system ports [45]. In this measurement phase, the network parameters of the DUT [47] at the DUT ports [48] are defined as the device under test network parameters. The network parameters of the system [49] at the system ports [45] are defined as the measurement phase system network parameters. In a de-embedding operation, it is at least an object to determine the device under test network parameters given measurements of the measurement phase system network parameters.

As the measurement phase system network parameters provide port-to-port effects of the system, when only one port is considered (i.e. the port-to-port effects involve a same port e.g. port 1 to port 1), these effects are defined as the measurement phase return loss system network parameters. The measurement phase return loss system network parameters are the effects from one port while stimulating that one port of the measurement phase system network parameters. An impedance profile can be generated for each port of the measurement phase system utilizing the measurement phase return loss system network parameters subset of the measurement phase system network parameters in accordance with the present method. When this impedance profile is generated for an electrical length that is as long as the connection element, and is thought to represent substantially the impedance profile of a connection element, it is defined for each connection element as a measurement phase connection element impedance profile.

Each measurement phase connection element impedance profile can be converted into a representative model for a connection element in various manners as outlined previously (e.g. as considering the impedance profile to represent the impedance of cascaded elements of a transmission line) and is defined as a measurement phase connection element representative model. The conversion of a measurement phase connection element impedance profile to a measurement phase connection element representative model can also consider but is not limited to consideration of loss and group delay characteristics. Loss, group delay and electrical length characteristics for connection elements defined as a connection element loss characteristic, connection element group delay characteristic, and connection element electrical length respectively.

A measurement phase connection element representative model can be converted to network parameters for the connection elements through many methods as shown in various embodiments of the present invention. (e.g. by cascading T-parameters of transmission line sections and converting the final T-parameters back to s-parameters) and are defined as measurement phase connection element network parameters. Note that subsequently defined connection element models determined in a calibration phase can also be converted to measurement phase connection element network parameters.

FIG. 17 shows a block diagram of a system [54] containing a standard [52] and multiple connection elements [51]. The standard [52] is connected such that the standard ports [53] are each connected to a second port of each of the connection elements [51] and the first port of each of the connection elements [51] are exposed as system ports [50]. In this calibration phase, the network parameters of the standard [52] at the standard ports [53] are defined as the standard network parameters. The network parameters of the system [54] at the system ports [50] are defined as the calibration phase system network parameters. The network parameters of the connection elements [51] are defined as the calibration phase connection element network parameters. In a calibration operation, it is at least an object to determine the calibration phase connection element network parameters given measurements of the calibration phase system network parameters.

As the calibration phase system network parameters provide port-to-port effects of the system, when only one port is considered (i.e. the port-to-port effects involve a same port e.g. port 1 to port 1), these effects are defined as the calibration phase return loss system network parameters. The calibration phase return loss system network parameters are the effects from one port while stimulating that same one port of the calibration phase system network parameters. An impedance profile can be generated for each port of the calibration phase system utilizing the calibration phase return loss system network parameters subset of the calibration phase system network parameters in accordance with the present method. This impedance profile is defined as a calibration phase system port impedance profile. When this impedance profile is generated for an electrical length that is as long as the connection element, and is thought to represent substantially the impedance profile of a connection element, it is defined for each connection element as a calibration phase connection element impedance profile.

Each calibration phase connection element impedance profile can be converted into a representative model for a connection element in various manners as outlined previously (e.g. as considering the impedance profile to represent the impedance of cascaded elements of a transmission line) and is defined as a calibration phase connection element representative model. The conversion of a calibration phase connection element impedance profile to a calibration phase connection element representative model can also consider but is not limited to consideration of loss and group delay characteristics.

A calibration phase connection element representative model can be converted to network parameters for the connection elements through many methods as shown in the present method and are defined as calibration phase connection element network parameters. Note that calibration phase connection element network parameters can also be converted to measurement phase connection element network parameters to be used in a measurement phase.

Note while FIG. 17 shows a block diagram of a system [54] containing a standard [52] connected to all connection elements [51], frequently there are multiple calibration phases and calibration configurations utilized employing different standards with less ports and employing less connection elements.

Note that in both FIG. 16 and FIG. 17, various elements including the calibration phase connection elements [51] and measurement phase connection elements [46], DUT [47], standard [52], calibration phase system [54] and measurement phase system [49] have effects that can be both measured and calculated. Generally, these measurements and calculations are made in efforts to triangulate the DUT measurement and to determine the device under test network parameters. The methods presented in the present invention incorporate mixtures of measurement and calculation of the effects of multiple elements.

It will thus be seen that the objects set forth above, among those made apparent from the preceding description, are efficiently attained and, because certain changes may be made in carrying out the above method and in the construction(s) set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed:

1. A system for calculating one or more device under test network parameters, comprising:
    first and second robes for probing printed circuit board trace and measuring one or more measurement phase system network parameters for a system comprising a device under test and one or more connection elements;
    first and second cables corresponding to the first and second probes for transferring the measured one or more measurement phase system network parameters;
    first and second ports of a measurement instrument corresponding to the first and second cables receiving the transferred, measured one or more measurement phase system network parameters, the measurement instrument further comprising a processor, the processor performing the steps of:
    calculating a measurement phase connection element impedance profile including an electrical length and a loss characteristic for each of the one or more connection elements in accordance with at least the measured one or more measurement phase system network parameters;
    generating a measurement phase connection element representative model of each of the one or more connection elements in accordance with at least the corresponding calculated measurement phase connection element impedance profile and electrical length and loss characteristic; and
    calculating one or more device under test network parameters by removing any effects of the one or more connection elements at the corresponding electrical length from the measurement phase system network parameters.

2. The system of claim 1, wherein the step of calculating the one or more device under test network parameters further comprises the steps of:
    calculating one or more measurement phase connection element network parameters in accordance with each measurement phase connection element representative model of each of the one or more connection elements; and
    removing the one or more measurement phase connection element representative model for each of the one or more connection elements from the measurement of the one or more measurement phase system network parameters.

3. The system of claim 1 wherein the step of generating the measurement phase connection element representative model of each of the one or more connection elements further comprises the steps of:
    approximating the effect of the connection element as a sequence of one or more transmission line sections, wherein each of the one or more transmission line sections is defined by an impedance in accordance with the corresponding measurement phase connection element impedance profile; and
    mathematically cascading the one or more transmission line sections.

4. The system of claim 3, wherein each of the one or more transmission line sections is further defined in accordance with a predetermined connection element loss characteristic.

5. The system of claim 3, wherein each of the one or more transmission line sections is further defined in accordance with a predetermined connection element group delay characteristic.

6. The system of claim 1, wherein the measurement phase connection element representative model is further defined in accordance with a predetermined connection element loss characteristic.

7. The system of claim 1, wherein the measurement phase connection element representative model is further defined in accordance with a predetermined connection element group delay characteristic.

8. The system of claim 1, wherein the calculation of the measurement phase connection element impedance profile for each of the one or more connection elements further comprises the steps of:
    determining an impedance of the connection element at a plurality of times, wherein the impedance at each of the plurality of times is calculated in accordance with the steps of:

(a) calculating a reflection coefficient at the first interface of a system characterized by measurement phase return loss system network parameters in accordance with the measurement phase system network parameters;
(b) calculating new measurement phase return loss system network parameters with the calculated reflection coefficient effect removed therefrom; and
(c) repeating steps (a) and (b) employing the new calculated measurement phase return loss system network parameters calculated in step (b) substituted for the measurement phase return loss system network parameters until an electrical length is reached.

9. A system for calculating one or more calibration phase connection element network parameters for one or more connection elements, comprising:
   first and second robes for probing printed circuit board trace for measuring one or more calibration phase system network parameters for a system comprising one or more measurement standards and one or more connection elements;
   first and second cables corresponding to the first and second probes;
   first and second ports of a measurement instrument corresponding to the first and second cables, the measurement instrument further comprising a processor, the processor performing the steps of:
   calculating a calibration phase system port impedance profile including an electrical length and a loss characteristic for each of the one or more system ports in accordance with at least the measured calibration phase system network parameters;
   generating a calibration phase connection element representative model of each of the one or more connection elements including electrical length and loss characteristic in accordance with at least the corresponding calculated calibration phase system port impedance profile; and
   calculating one or more calibration phase connection element network parameters of each of the one or more connection elements in accordance with each corresponding calibration phase connection element representative model and electrical length.

10. The system of claim 9, wherein the step of generating the calibration phase connection element representative model of each of the one or more connection elements further comprises the steps of:
    identifying a calibration phase connection element impedance profile as a portion of the calibration phase system port impedance profile; and
    generating the calibration phase connection element representative model in accordance with the identified calibration phase connection element impedance profile.

11. The system of claim 9, wherein the calculation of the one or more calibration phase connection element network parameters of each of the one or more connection elements is performed by tuning the corresponding calibration phase connection element representative model such that one or more calculated calibration phase system network parameters with the effects of the connection elements removed substantially match one or more predetermined standard network parameters.

12. The system of claim 9, wherein the calculation of the one or more calibration phase connection element network parameters of each of the one or more connection elements is performed by tuning the corresponding calibration phase connection element representative model such that the one or more calibration phase system network parameters matches one or more calculated standard network parameters with the effects of the connection elements added thereto.

13. The system of claim 9, further comprising the step of calculating a connection element loss characteristic in accordance with the calculated calibration phase connection element network parameters.

14. The system of claim 9, further comprising the step of calculating a connection element group delay characteristic in accordance with the calculated calibration phase connection element network parameters.

15. A system for calculating one or more device under test network parameters, comprising:
    first and second robes for probing printed circuit board trace;
    first and second cables corresponding to the first and second probes;
    first and second ports of a measurement instrument corresponding to the first and second cables, the measurement instrument further comprising a processor, the processor performing the steps of:
    in a calibration phase:
    measuring in accordance with the first and second probes one or more calibration phase system network parameters for a system comprising one or more measurement standards and one or more connection elements;
    calculating a calibration phase system port impedance profile including an electrical length and a loss characteristic for each of the one or more system ports in accordance with at least the measured calibration phase system network parameters;
    generating a calibration phase connection element representative model for each of the one or more connection elements including electrical length and loss characteristic in accordance with at least the corresponding calculated calibration phase system port impedance profile; and
    calculating one or more calibration phase connection element network parameters of each of the one or more connection elements in accordance with each corresponding calibration phase connection element representative model including the electrical length; wherein the calculation of the one or more calibration phase connection element network parameters of each of the one or more connection elements is performed by tuning the corresponding calibration phase connection element representative model such that one or more calculated calibration phase system network parameters with the effects of the connection elements removed match one or more predetermined standard network parameters; and
    in a measurement phase:
    measuring in accordance with the first and second probes one or more measurement phase system network parameters for a system comprising a device under test and one or more connection elements; and
    calculating one or more device under test network parameters by removing any effects of the one or more connection elements from the measurement phase system network parameters.

16. The system of claim 15, wherein the effects of the one or more connection elements is determined in accordance with the one or more calibration phase connection element network parameters.

17. The system of claim 16, wherein the effects of the one or more connection elements are removed by de-embedding the calibration phase connection element network parameters from the measurement phase system network parameters.

18. The system of claim 15, further comprising the steps of:

in the calibration phase:

determining a connection element electrical length in accordance with the calculated calibration phase system port impedance profile;

in the measurement phase:

calculating a measurement phase connection element impedance profile for each of the one or more connection elements in accordance with at least the measured measurement phase system network parameters, each measurement phase connection element impedance profile spanning the determined connection element electrical length; and generating a measurement phase connection element representative model of each of the one or more connection elements in accordance with at least the corresponding calculated measurement phase connection element impedance profile; whereby the step of calculating the one or more device under test network parameters is performed by removing effects of the one or more connection elements from the measurement phase system network parameters in accordance with the measurement phase connection element representative model of the one or more connection elements.

19. The system of claim 15, further comprising the steps of:

in the calibration phase:

determining a connection element loss characteristic in accordance with the calibration phase system network parameters;

in the measurement phase:

calculating a measurement phase connection element impedance profile for each of the one or more connection elements in accordance with at least the determined connection element loss characteristic, each measurement phase connection element impedance profile spanning a determined connection element electrical length; and generating a measurement phase connection element representative model of each of the one or more connection elements in accordance with at least the corresponding calculated measurement phase connection element impedance profile;

whereby the step of calculating one or more device under test network parameters is performed by removing effects of the one or more connection elements from the measurement phase system network parameters in accordance with the measurement phase connection element representative model of the one or more connection elements.

20. The system of claim 15, further comprising the steps of:

in the calibration phase:

determining a connection element group delay characteristic in accordance with the calibration phase system network parameters; in the measurement phase:

calculating a measurement phase connection element impedance profile for each of the one or more connection elements in accordance with at least the determined connection element group delay characteristic, each measurement phase connection element impedance profile spanning a determined connection element electrical length; and generating a measurement phase connection element representative model of each of the one or more connection elements in accordance with at least the corresponding calculated measurement phase connection element impedance profile;

whereby the step of calculating one or more device under test network parameters is performed by removing effects of the one or more connection elements from the measurement phase system network parameters in accordance with the measurement phase connection element representative model of the one or more connection elements.

* * * * *